(12) United States Patent
Cathelin et al.

(10) Patent No.: US 8,188,811 B2
(45) Date of Patent: May 29, 2012

(54) FILTERING CIRCUIT WITH COUPLED ACOUSTIC RESONATORS

(75) Inventors: Andrea Cathelin, Laval (FR); Didier Belot, Rives (FR); Alexandre Augusto Shirakawa, Talence (FR); Eric Kerherve, Talence (FR); Jean-Marie Pham, Merignac (FR); Pierre Jary, Talence (FR)

(73) Assignees: STMicroelectronics S.A., Montrouge (FR); Centre National de la Recherche Scientifique (C.N.R.S.), Paris (FR)

( * ) Notice: Subject to any disclaimer, the term of this patent is extended or adjusted under 35 U.S.C. 154(b) by 421 days.

(21) Appl. No.: 12/371,468

(22) Filed: Feb. 13, 2009

(65) Prior Publication Data

US 2009/0256650 A1    Oct. 15, 2009

(30) Foreign Application Priority Data

Feb. 15, 2008    (FR) ...................... 08 00828

(51) Int. Cl.
*H03H 9/54* (2006.01)
*H03H 3/02* (2006.01)
(52) U.S. Cl. .......... 333/189; 333/191; 29/25.35; 29/594
(58) Field of Classification Search .................. 333/189, 333/191, 192, 133; 29/25.35, 594
See application file for complete search history.

(56) References Cited

U.S. PATENT DOCUMENTS

| | | | |
|---|---|---|---|
| 6,720,844 B1 * | 4/2004 | Lakin ........................... | 333/189 |
| 6,963,257 B2 * | 11/2005 | Ella et al. ...................... | 333/133 |
| 7,098,758 B2 * | 8/2006 | Wang et al. .................... | 333/189 |
| 7,525,399 B2 * | 4/2009 | Yanase et al. .................. | 333/189 |
| 7,825,749 B2 * | 11/2010 | Thalhammer et al. ........ | 333/189 |
| 2005/0206476 A1 | 9/2005 | Ella et al. | |
| 2006/0119453 A1 * | 6/2006 | Fattinger et al. .............. | 333/189 |
| 2008/0297279 A1 * | 12/2008 | Thalhammer et al. ........ | 333/189 |

FOREIGN PATENT DOCUMENTS

EP    2 091 147 A1 *    8/2009

OTHER PUBLICATIONS

K.M. Lakin; "Thin Film BAW Filters for Wide Bandwidth And High Performance Applications"; 2004 IEEE MTT-S International Microwave Symposium Digest; Jun. 6-11, 2004, vol. 2, pp. 923-926.*
Shirakawa, A. A. et al., "Bulk Acoustice Wave Coupled Resonator Filters Synthesis Methodology," 2005 European Microwave Conference CNIT LA Defense, Paris, France, Oct. 4-6, 2005, pp. 549-552.

* cited by examiner

*Primary Examiner* — Barbara Summons
(74) *Attorney, Agent, or Firm* — Seed IP Law Group PLLC (57) ABSTRACT

A filter with coupled resonator having a substrate; an acoustic mirror intended to support acoustic resonators, and to isolate these resonators from the substrate; a first structure with an upper resonator and a lower resonator coupled to one another through at least one layer of acoustic coupling; a second structure with an upper resonator and a lower resonator coupled to one another through at least one layer of acoustic coupling; the lower resonators of the first and second structure having the same electrodes. The first and second structures are connected via a fifth resonator for which electrodes and the piezoelectric layer of the lower resonators are of the first and second structure.

27 Claims, 10 Drawing Sheets

FILTERING CIRCUIT WITH COUPLED ACOUSTIC RESONATORS

BACKGROUND

1. Technical Field

The present disclosure relates to electronic circuits and, in particular, to a filtering circuit with coupled acoustic resonators.

2. Description of the Related Art

Today acoustic resonators are widespread in consumer applications as well as in professional applications because of their high efficiency, including the realization of high performance band pass filters used in mobile telephony.

Research has been made on two types of acoustic resonators that show remarkable performance, namely the SAW resonators (Surface Acoustic Wave Resonator) and, more recently, those of type BAW (Bulk Acoustic Wave Resonator). In the first type, the acoustic resonator is located on the surface of a semiconductor product while, in BAWs, it lays inside a volume delimited between a lower electrode and a higher electrode so that the acoustic wave develops in this volume. BAW resonators are the subject of substantial research by manufacturers of semi-conductor products because those components allow for a high degree of integration of filtering circuits, thus consequently anticipating significant manufacturing cost savings.

BAW resonators allow higher frequencies than those used with SAWs, while achieving more compact structures.

Conventionally, BAW resonators are combined so as to form more complex structures, such as "ladder" or "lattice" in order to achieve highly effective band pass filters.

Figure 1:
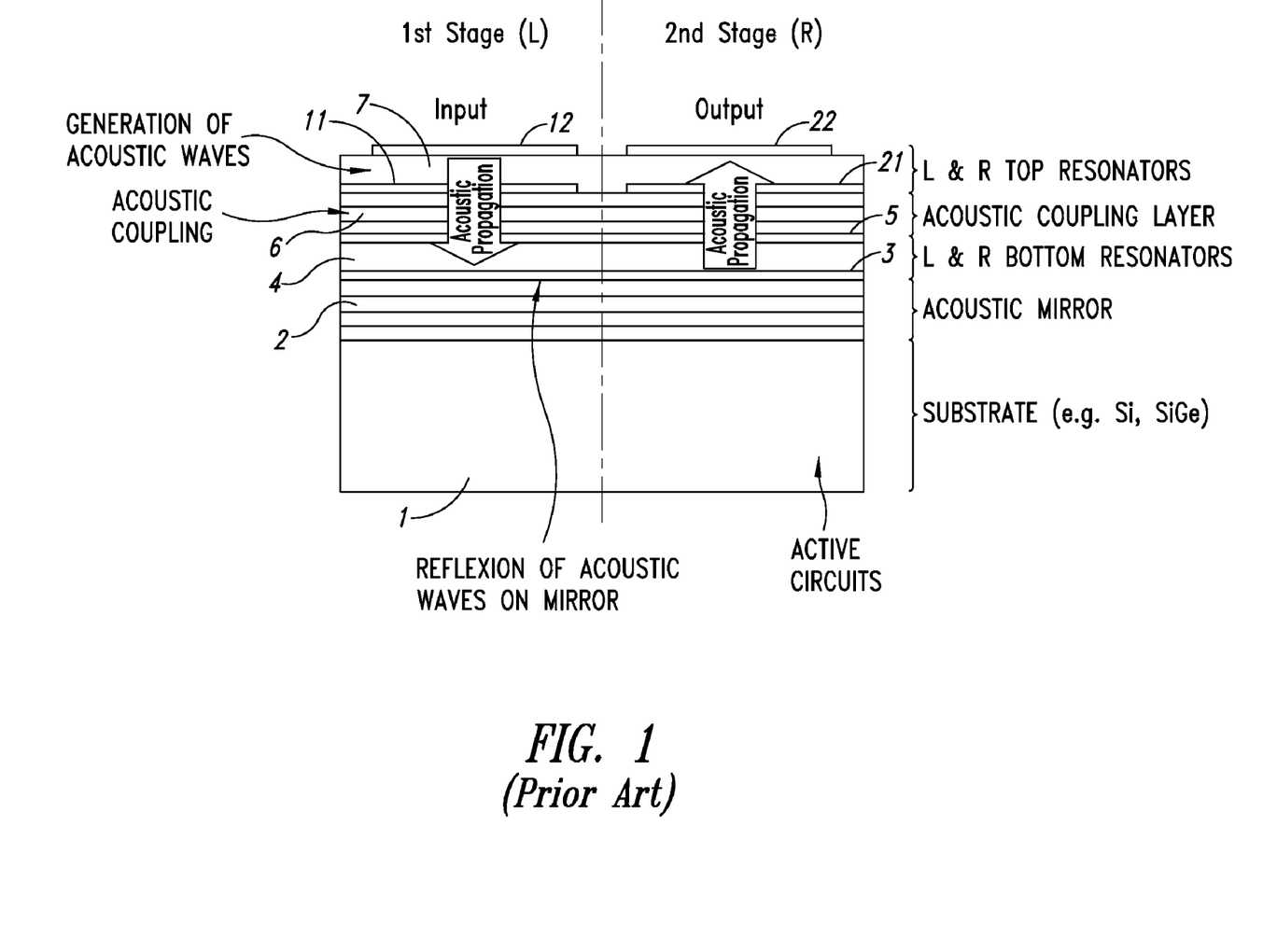
FIG. 1 illustrates the structure of a known CRF circuit filter type.

Another known combination of resonators is based on the coupling of several resonators in order to achieve a more complex structure, such as the Coupled Resonator Filter (CRF), which is illustrated in FIG. 1.

This circuit includes, as illustrated in the figure, two structures or stages perfectly symmetrical with respect to an axis of symmetry running along the middle of the figure.

A first stage comprises an upper resonator having two electrodes, respectively a bottom electrode 11 and a top electrode 12 separated by a layer of piezoelectric material 7. The structure is located above a layer 6 performing an acoustic coupling, which is located on a lower resonator with two electrodes, respectively a bottom electrode 3 and an top electrode 5 separated by a layer of piezoelectric material 4.

On the other side of the vertical axis, and in perfect symmetry with the first stage, the circuit includes a second stage comprising an upper resonator and a lower resonator separated by the layer of an acoustic coupling 6. The upper resonator includes two electrodes, respectively an bottom electrode 21 and a top electrode 22 separated by layer 7. The lower resonator includes electrodes 3 and 5 encompassing the layer 4.

The two-stage structure is arranged on an acoustic mirror 2, which is itself located on a silicon substrate 1 or SiGe, possibly comprising logic and analog MOS or CMOS circuits.

This so-called CFR structure is well known to those skilled in the art and will not be further described as to its structure or its manufacturing process. Briefly, the upper resonator (electrodes 11 and 12 and layer 7) receives the electrical signal to be filtered and such signal is converted into an acoustic wave which is a volume wave.

This acoustic wave propagates from top to bottom via acoustic coupling layer 6, to the lower resonator of the first stage where it is converted into an electric signal which is then forwarded to the lower resonator of the second stage since the latter shares the same electrodes than the lower resonator of the first stage.

The wave volume then propagates up to the layers of the second stage and, through the acoustic coupling of layer 6, reaches the upper resonator of the second stage, which is located to the right of FIG. 1.

Figure 2:
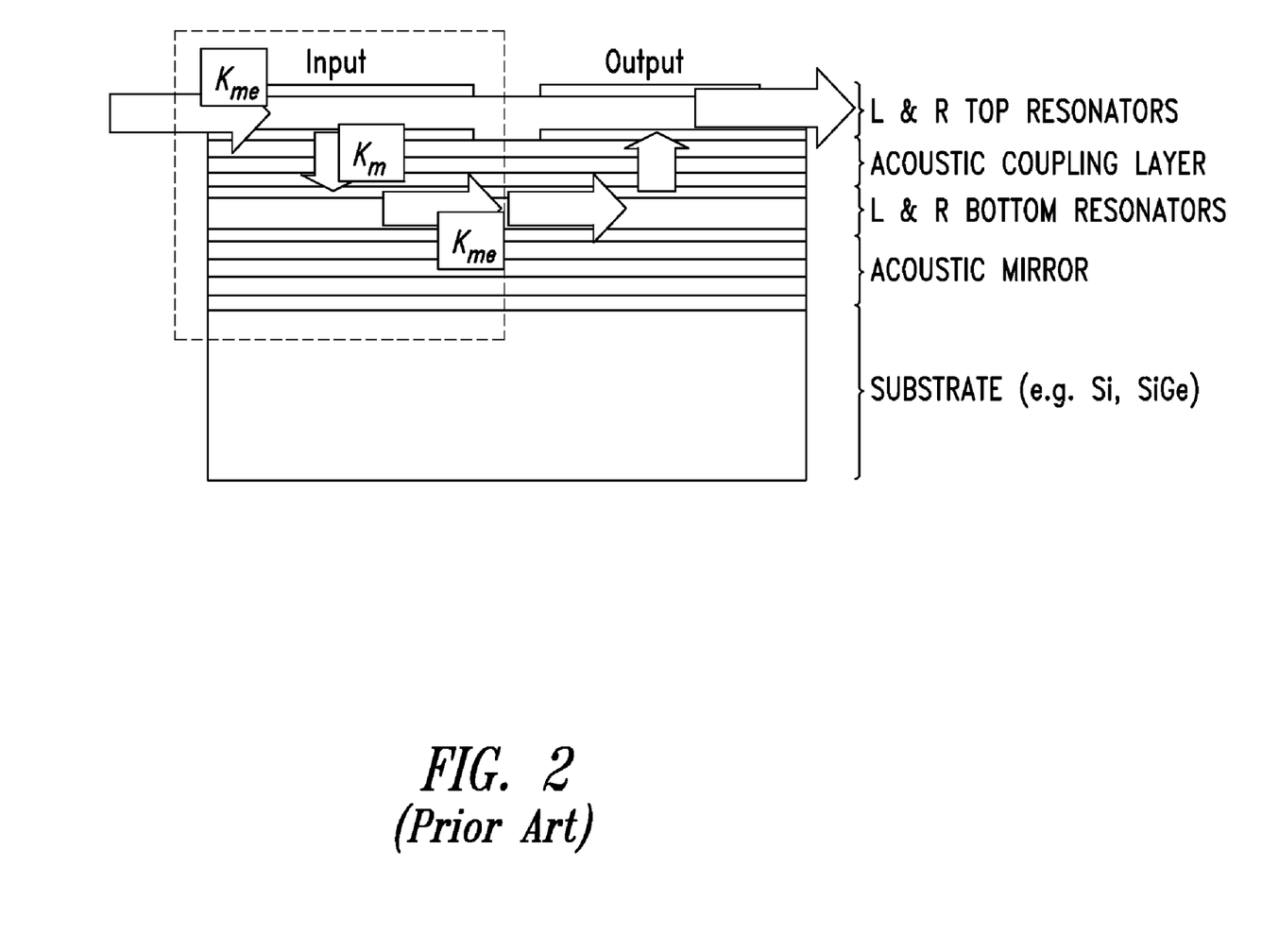
FIG. 2 illustrates the schema of path wave volume in the known CRF circuit.

FIG. 2 shows the actual path of the wave volume within the two structures, left and right respectively, of circuit CRF, and through successive coupling, electro-mechanical and also mechanical.

Figure 3:
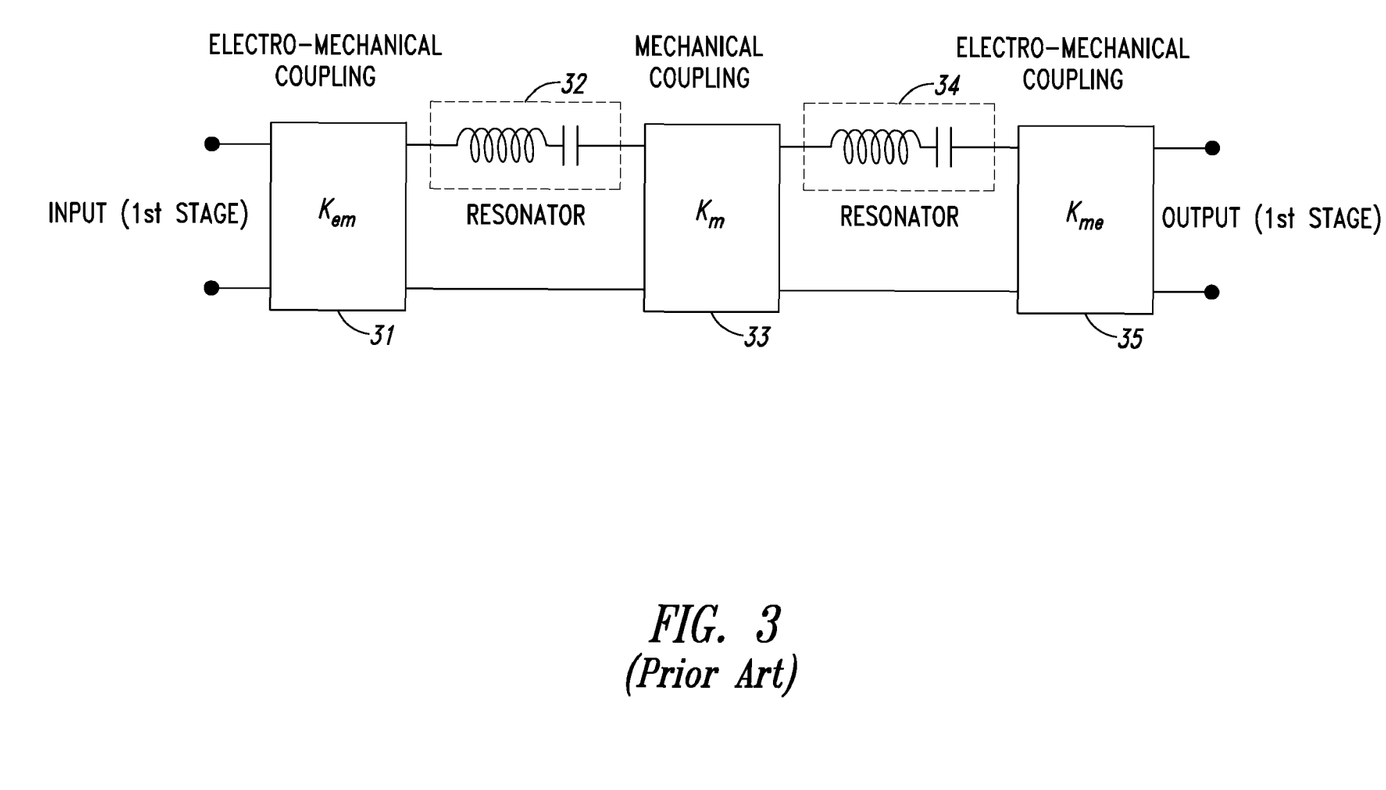
FIG. 3 illustrates the electrical model equivalent of the first floor of the known CRF circuit.

FIG. 3 particularly illustrates a coupling chain carried out in the CRF filter. The upper and lower resonators are represented respectively by items 32 and 34 of FIG. 3. One may see that the electrical signal that is input in the first stage is subject to an electro-mechanical conversion (Kem), thus resulting in a transfer of electrical energy to mechanical energy represented by a block of electro-mechanical coupling Kem 31.

The volume wave is transmitted to the lower resonator of the first stage, through the layer 6, which provides a purely mechanical coupling Km, represented by the block 33.

The lower resonator of the first stage receives this wave and converts the received mechanical energy into an electrical energy resulting in an electrical signal to terminals 3 and 5 of right lower resonators.

This electrical signal is then transmitted to the lower resonator of the second stage because it shares the same electrodes as the lower resonator of the first stage.

Figure 4:
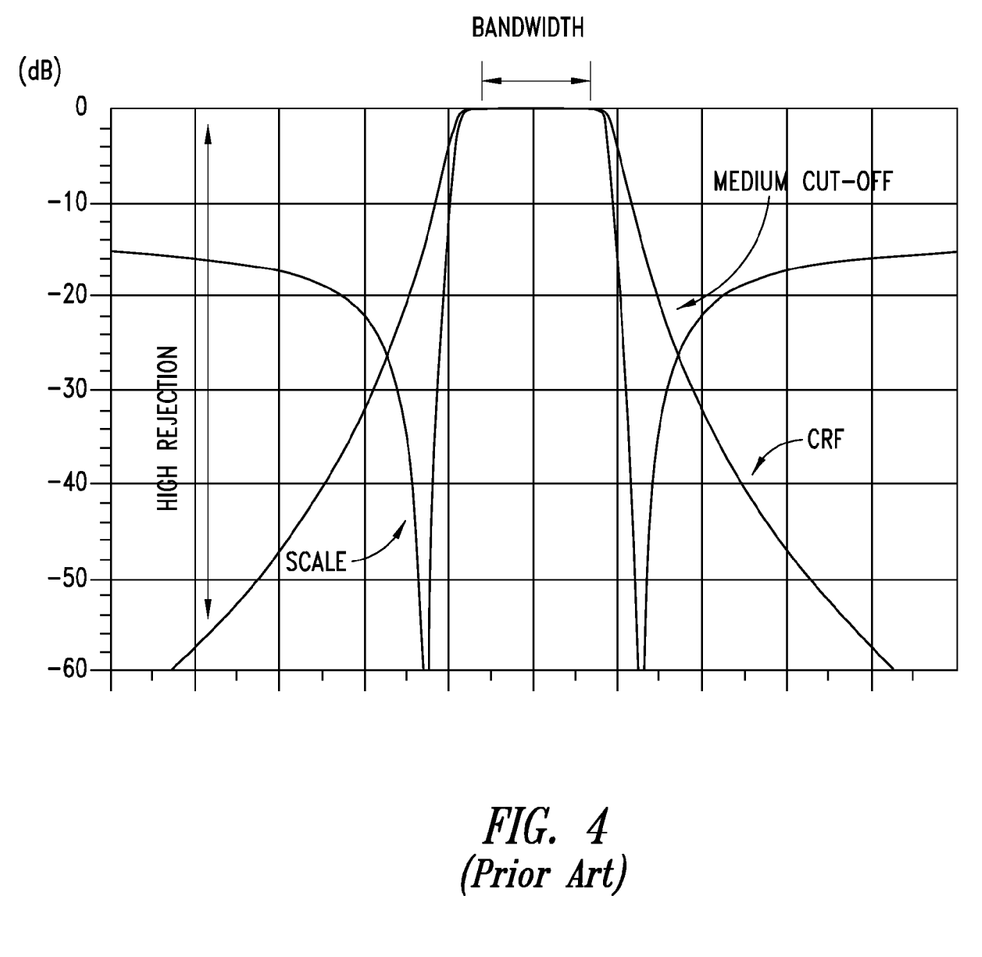
FIG. 4 illustrates more particularly the comparison of the filtering curve of a CRF circuit compared to a group of classical resonators of the BAW type.

FIG. 4 illustrates more particularly the comparison of the filtering curve of a CRF circuit with a classical group of resonator BAW of type <<scale>>.

At equal bandwidth, the CRF circuit provides a rejection rate higher than that of a classical SCALE, and especially far from the bandwidth. This produces an efficient filtering over a wideband frequency.

This performance gain of CRF circuit is obtained together with a limitation of the space required in the semiconductor circuit since the CRF structure allows for stacking two BAW resonators to form a single stage.

This circuit can also be easily combined with another CRF circuit to make a filtering circuit with two impedances, respectively of input Zin and of output Zout, separate.

To this end, it combines two CRF circuits by connecting the input floors in parallel and the output floors in series.

Finally, the filter with coupled resonators ease the conversion to a differential structure.

Despite these advantages, the CRF circuit shows, furthermore a difficulty in obtaining a higher achievement, which is a serious disadvantage.

Indeed one may observe that in a neighborhood near the bandwidth, the circuit selectivity shows a slope that is less steep than the one resulting from the LADDER structure. Such a drawback is critical in the field of wireless communications based on the use of different—but close—frequency bands that need to be efficiently filtered.

Particularly, in the case of mobile communications of the new generation, it is planned to arrange two bands of frequency that are very closed, a first band for broadcast communications and a second band for the reception and, clearly, in such a context, the CRF shows to be unsuitable.

Obviously, it has been considered to combine different structures of identical CRF filters in order increase the overall order of the band-pass filter and, therefore, to improve the selectivity of the filtering process in the vicinity of the band. However, this solution would lead to a significant increase in surface area on the semiconductor substrate, and more importantly, it would lead to increased losses in the filter reducing the coefficient quality of the filter.

Such is the problem which is addressed by the present disclosure.

BRIEF SUMMARY

The present disclosure provides a circuit of band-pass filter based on acoustic resonators of the BAW type that are mechanically coupled, providing improved selectivity, even in the vicinity of the bandwidth. The present disclosure also provides a powerful filter band-pass circuit that can be used in applications of mobile telephony of last generation.

The present disclosure is further directed to a powerful filter band pass circuit that can be integrated inside a semiconductor product and limiting the space used on the semiconductor substrate.

The foregoing features and advantages of the present disclosure are achieved by means of a resonator coupled filter a substrate; an acoustic mirror intended to support acoustic resonators, and to isolate these resonators from the substrate; a first structure with an upper resonator and a lower resonator coupled to one another through at least one layer of acoustic coupling; and a second structure with an upper resonator and a lower resonator coupled to one another through at least one layer of acoustic coupling. Upper resonators of the first and second structure are used respectively for entry and exit to the filter, and lower resonators of the first and second structure have the same electrodes.

Ideally, the filter has first and second structures are connected via a fifth resonator for which electrodes and the piezoelectric layer are those of the lower resonators of the so-called first and second structure.

In one embodiment, the first and second structures are perfectly symmetrical with respect to a vertical axis.

In another embodiment, the resonators are resonators of the Bulk Acoustic Wave (BAW) type.

Preferably, the BAW resonators are made by techniques of thin film deposition, sputtering, vacuum evaporation or deposition CVD (Chemical Vapor Deposition).

In an embodiment, the BAW resonators include a piezoelectric material that is ZnO, AlN, ZnS or ferroelectric ceramic.

In one particular embodiment, the resonators include electrodes made of tungsten (W), aluminum (Al), copper (Cu), molybdenum (Mo), nickel (Ni), titanium (Ti), silver (Ag), gold (Au) or tantalum (Ta), including or in any combination thereof.

The present disclosure is also directed to a manufacturing process of a circuit filter with coupled resonators that includes the following steps: preparing a substrate; arranging an acoustic mirror above the substrate; and depositing a first and second structure having each a lower resonator with a bottom electrode, a top electrode, and a piezoelectric layer, and having in addition an upper resonator with a bottom electrode, a top electrode, and a piezoelectric layer; the lower and upper resonators of each of the structures being separated by a layer of acoustic coupling.

Ideally, the first and second structures are spaced sufficiently to enable the insertion, between the two structures, of a fifth resonator, preferably of the SMR type, sharing the electrodes and the piezoelectric layer of the said lower resonators.

In accordance with another embodiment of the present disclosure, a filter is provided that includes first and second resonator structures formed on a substrate and isolated therefrom by an acoustic mirror and coupled to one another by a third resonator structure formed over the acoustic mirror, the third resonator structure sharing electrodes and a piezoelectric layer of the first and second resonator structures.

In accordance with another aspect of the foregoing embodiment, the first and second resonator structures each include an upper resonator and a lower resonator coupled to one another through at least one layer of acoustic coupling.

In accordance with another aspect of the foregoing embodiment, the upper resonators of the first and second resonator structures each form an input and an output, respectively, of the filter, and the lower resonators of the first and second resonator structures share the same electrodes In accordance with another aspect of the foregoing embodiment, the third resonator structure includes a resonator sharing the electrodes and the piezoelectric layer of those of the lower resonators of the first and second structures.

In accordance with another aspect of the foregoing embodiment, the first and second structures are formed to be physically symmetrical about a vertical axis passing through the third resonator structure.

In accordance with another embodiment of the present disclosure, a process is provided that includes forming first and second resonator structures on a substrate so that the first and second resonator structures are isolated therefrom by an acoustic mirror, and coupling the first and second resonator structures to one another by a third resonator structure formed over the acoustic mirror, the third resonator structure sharing electrodes and a piezoelectric layer of the first and second resonator structures.

In accordance with another aspect of the foregoing embodiment, the first and second resonator structures are formed to have an upper resonator and a lower resonator coupled to one another through at least one layer of acoustic coupling, and wherein the upper resonators of the first and second resonator structures respectively comprise an input and an output of the filter, and the lower resonators of the first and second resonator structures share the same electrodes.

In accordance with another aspect of the foregoing embodiment, the third resonator structure shares the electrodes and the piezoelectric layer of the lower resonators of the first and second resonator structures, and the first and second resonator structures are formed to be physically symmetrical about a vertical axis passing through the third resonator structure.

BRIEF DESCRIPTION OF THE SEVERAL VIEWS OF THE DRAWINGS

Other features of one or more embodiments of the disclosure will best be understood by reference to the following detailed description when read in conjunction with the accompanying drawings, wherein.

DETAILED DESCRIPTION

There will now be described one embodiment of a circuit filter that has coupled resonators particularly suited to the realization of a circuit filter for use in mobile telephony, and integrated circuit type Very Large Scale Integration (VLSI). In mobile telecommunications, and particularly in the latest applications such as the Wide Code Division Multiplexing Access (WCDMA), there is a need to perform a very effective filtering process in order to separate different channels that are very close one another. It should be noted, however, that this is only a non-limiting example of the use of the new integrated acoustic component described below.

Figure 5:
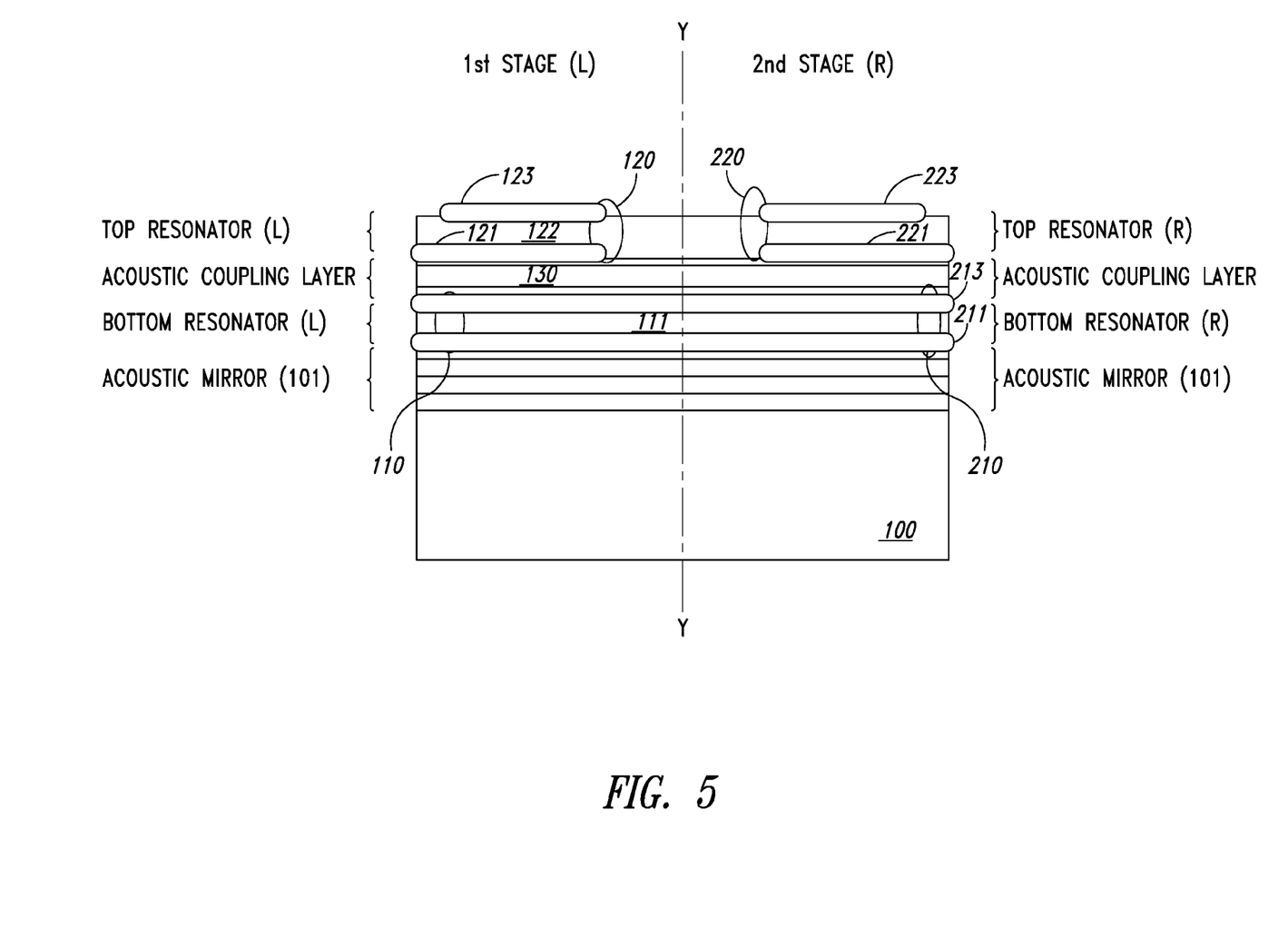
FIG. 5 illustrates a general architecture of a filtering CRF circuit adapted for implementation in the present disclosure.

With respect to FIG. 5, there is illustrated the realization of a filtering circuit with coupled resonators according to one embodiment of the present disclosure.

The filtering circuit is made of a substrate type silicon 100 made of silicon (Si), in Gallium arsenide (GaAs), glass or ceramic silicon. The substrate 100 may include conventional MOS structures to achieve logic circuits and analog circuits, which are not part of the present disclosure and which will not be further described.

The filtering circuit includes, above the substrate 100, a reflecting mirror 101—or mirror of BRAGG—which consists of a stack of layers with acoustic properties and different dielectric constants, prepared on the substrate 100. The reflective mirror ensures a minimum loss of acoustic waves within the substrate 100.

The circuit filter also includes, above the acoustic mirror, a set of four type BAW resonators split into two structures, respectively LEFT and RIGHT, substantially symmetrical to a vertical axis Y passing through the middle of the figure.

Figure 6:
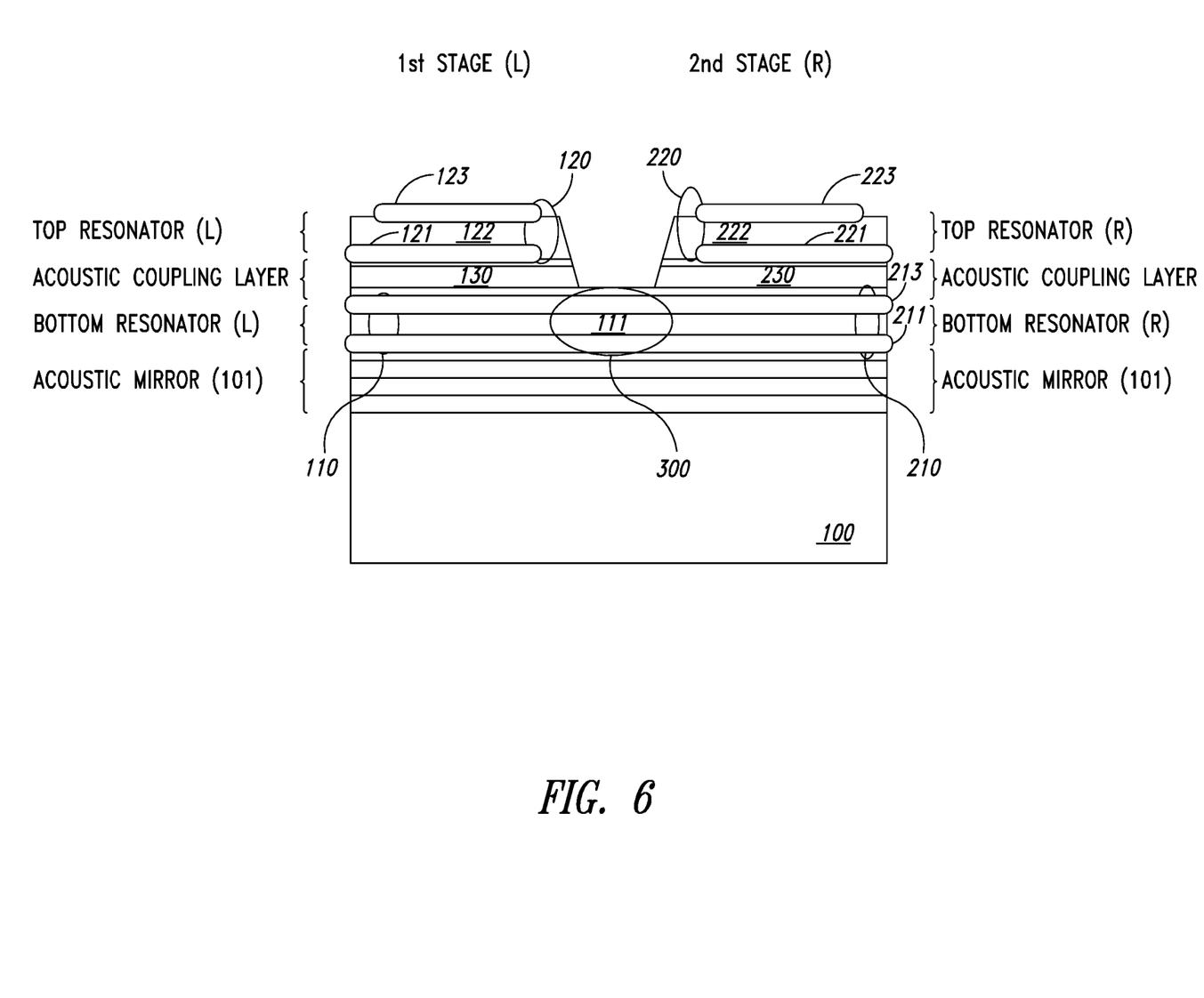
FIG. 6 illustrates the changes in the structure of FIG. 5 in order to achieve a circuit filter according to an embodiment of the present disclosure.

The two structures are similar in all aspects to the two known structures in a classic CRF filter with coupled resonators, with the exception of a specific adjustment of structures left and right with enough space to insert a fifth resonator 300, illustrated more particularly in the FIG. 6.

The two structures, respectively LEFT and RIGHT, each include a stack of two resonators, respectively upper and lower separated by a layer of acoustic coupling 130, that can be itself divided into sub-layer coupling, if necessary.

The resonators are acoustic resonators of the Bulk Acoustic Wave (BAW) type that are realized with known techniques of thin film deposition through sputtering techniques, vacuum evaporation deposition or CVD (Chemical Vapor Deposition), which are well known. Each resonator is made of a layer of piezoelectric material having acoustic characteristics, of two electrodes, respectively bottom and top, encompassing that layer. The piezoelectric material can be ZnO, ALN, ZnS or any ferroelectric ceramics known to those skilled in the art. Electrodes can be realized of any metal suited to the sought application, such as, by example, tungsten (W), aluminum (Al), copper (Cu), molybdenum (Mo), nickel (Ni), titanium (Ti), silver (Ag), gold (Au) or tantalum (Ta) or any combination thereof.

As can be seen in FIG. 5, the LEFT structure (resp. RIGHT) includes a lower resonator 110 (resp. 210) with a lower electrode 211 and an upper electrode 213 encompassing a layer of piezoelectric material 111.

The LEFT structure (resp. RIGHT) includes furthermore an upper resonator 120 (resp. 220) with a lower electrode 121 (resp. 221) and an upper electrode 123 (resp. 223) encompassing a layer of piezoelectric material 122. It can therefore be observed that the filter with coupled resonators takes a form that is similar to that of the CRF filters, except that the electrodes 211 and 213 taking in sandwich the material 111 show a larger size in order to allow sufficient spacing between the two LEFT and RIGHT structures, respectively.

It should be noted that the manufacturing steps of the elements illustrated in FIG. 5 are similar to the conventional process used for a classical CRF filter and will not be further elaborated.

With respect to FIG. 6, there is now described the specific features that distinguish the filtering circuit with coupled resonators from known CRF circuits. The space created between the LEFT and RIGHT structures arranged on both sides of the vertical axis of symmetry, is subject to a specific hollowing out in order to remove the piezoelectric layer 122, and also most of the layer of acoustic coupling 130, as can be seen in the figure. To achieve this, a conventional etching process is used, either dry or wet etching processing.

The etching process that is realized in the central area of the filtering circuit has the effect of disengaging the upper part of both structures LEFT and RIGHT. The hollowed part that was created is then filled by any conventional passivation layer, such as $SiO_2$ by example. The RIGHT structure thus includes a layer of acoustic coupling 230 that is separate from the original layer of acoustic coupling 130. Similarly, the upper resonator of RIGHT structure includes a piezoelectric layer 222 that is now separate from the original piezoelectric layer 122.

The hollowing out has achieved the effect of forming a fifth resonator 300 of SMR (Surface Mounted Resonator) type with electrodes 211 and 213 and encompassing piezoelectric layer 111.

This fifth resonator BAW provides also two resonance frequencies, depending on the particular piezoelectric material being used (ZnO, AlN, ZnS or any known ferroelectric ceramics), showing two pulse values, respectively series ($\omega s$ corresponding to a minimum impedance) and parallel ($\omega p$ corresponding to a maximum impedance). Outside the vicinity of the two frequencies of resonance, the resonator shows a capacitive behavior. The values of pulses $\omega s$ and $\omega p$ depend on the thickness of the piezoelectric material; and the gap between these two values results from the electromechanical coupling coefficient.

This fifth resonator 300, which can thus be achieved from the initial structure of the coupled resonators filter, entails the appearance of a zero transmission in the frequency curve, thus significantly increasing the slope of the frequency response of the filter in the vicinity of the bandwidth. As mentioned above, this was not satisfactorily handled with conventional CRF filters.

Figure 7:
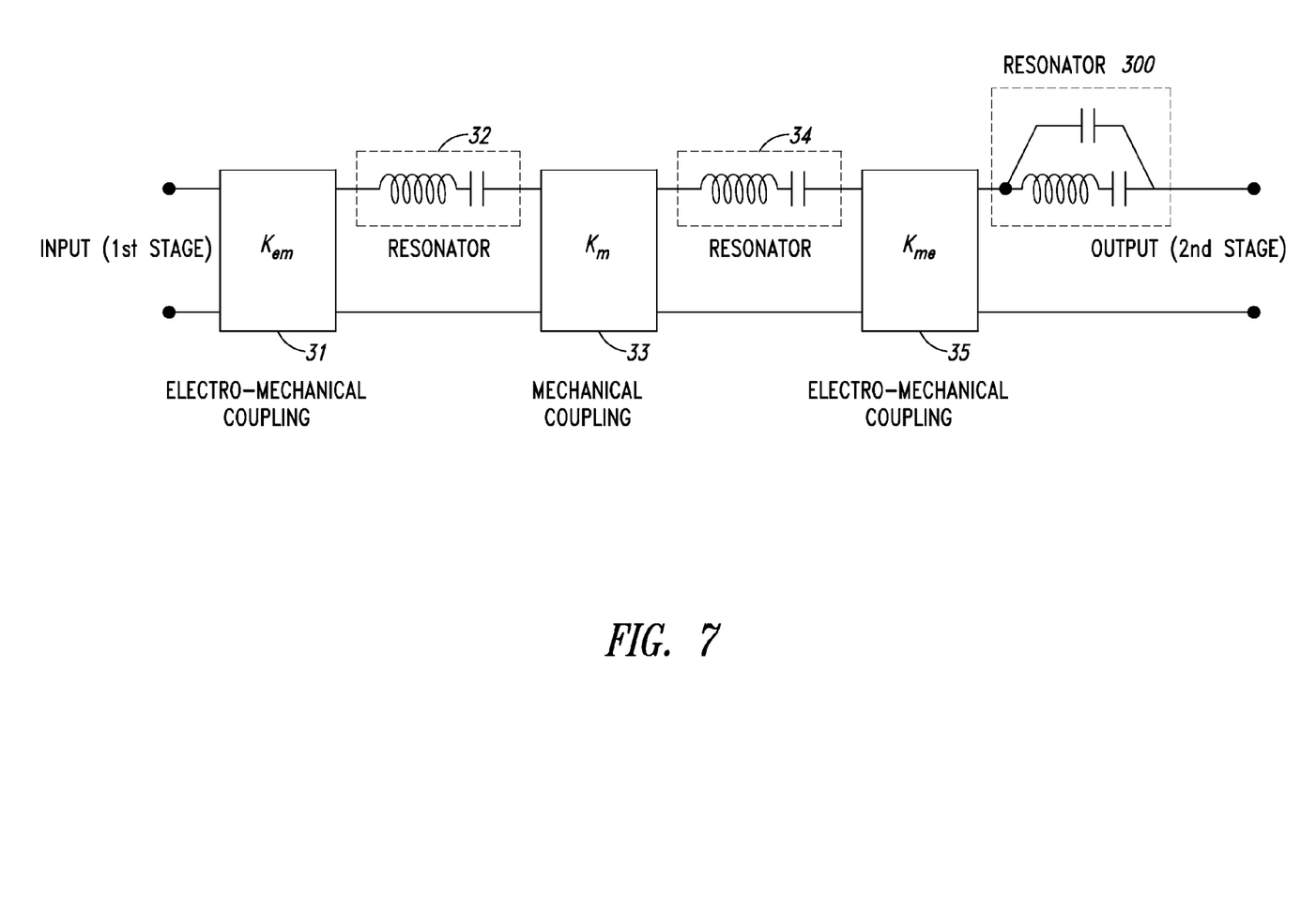
FIG. 7 illustrates more particularly the effect of the removal made between the two structures LEFT and RIGHT of the filter according to the present disclosure.

FIG. 7 particularly illustrates the effect of the hole made between the two structures LEFT and RIGHT of the filter according to the present disclosure. Elements that are common with those of FIG. 3 bear the same reference numerals. It can be seen that resonator 300 with its two resonance and anti-resonance frequencies is inserted at the output of the first stage 31.

Figure 8:
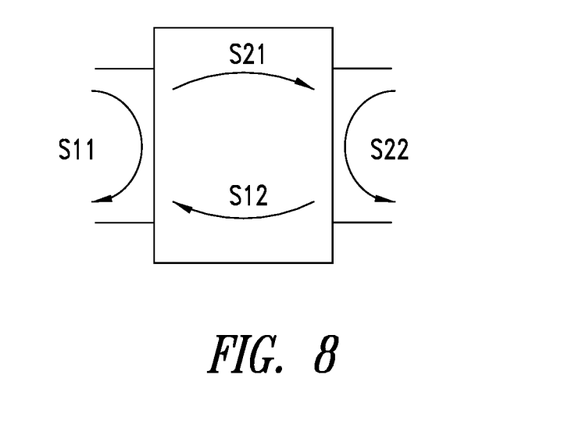
FIG. 8 shows the electrical model equivalent of the circuit in FIG. 7, reporting coefficients S11, S21, SC.

FIG. 8 shows the equivalent model of the filtering circuit quadripole with the definition of coefficients S11, S21, S12 and S22. The coefficient S11 is representative of the reflection losses within the filter while the coefficient S21 corresponds to the energy transferred throughout the quadripole.

Figure 9:
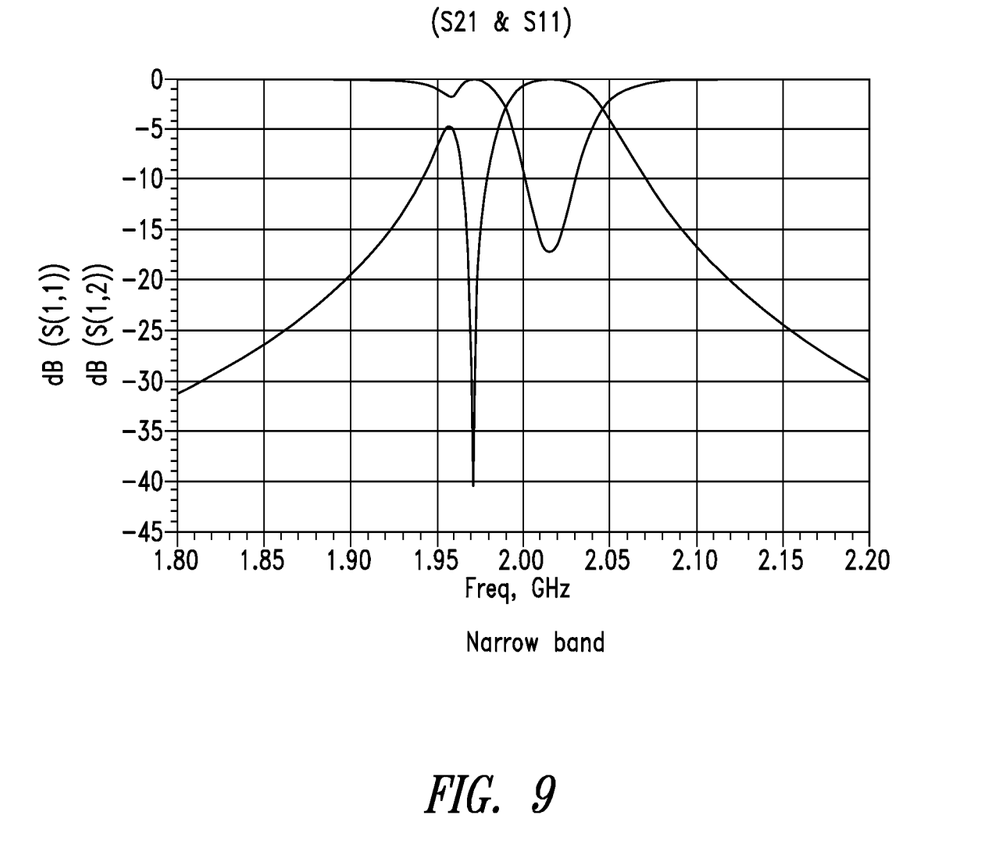
FIGS. 9 and 10 illustrate the wide band and narrow band performance curves, respectively.
Figure 10:
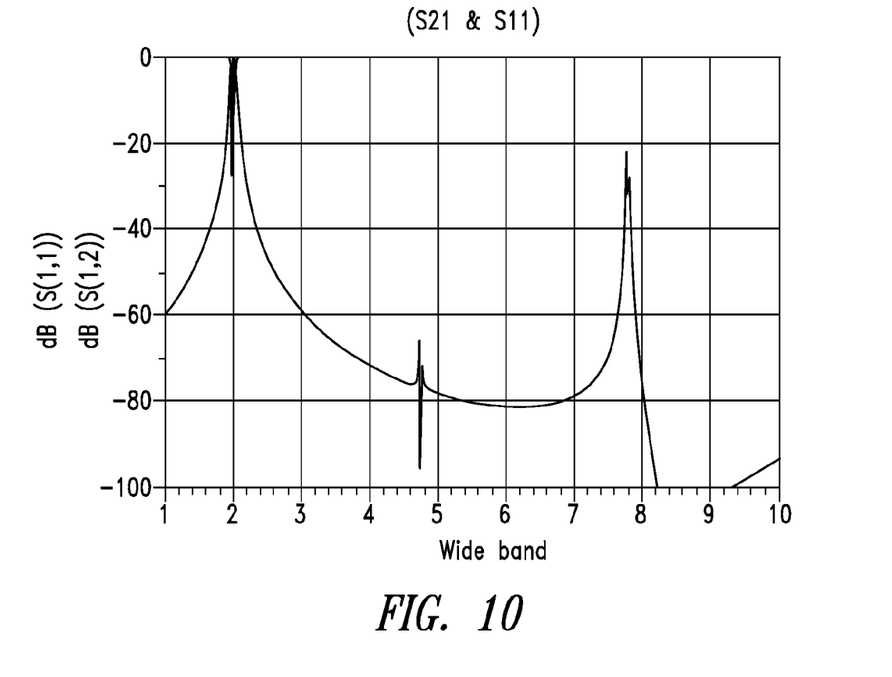
Figure 11:
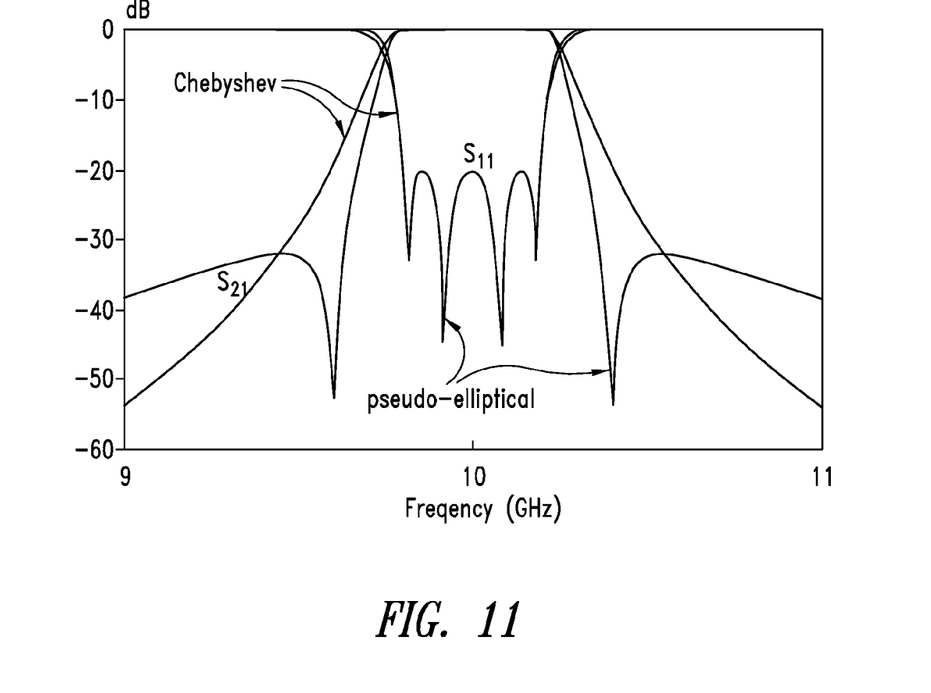
FIG. 11 illustrates coefficient S11 of the performance curve of a filtering circuit according to the present disclosure.

FIG. 9 illustrates the change in the filtering curve due to the presence of the fifth resonator 300 in the vicinity of the narrowband. FIG. 10 shows the change in the filtering curve due to the presence of the fifth resonator 300 in the broadband away significantly from the bandwidth. FIG. 11 illustrates the curves representing factors S11 and S21 of the circuit according to the present disclosure.

Figure 12:
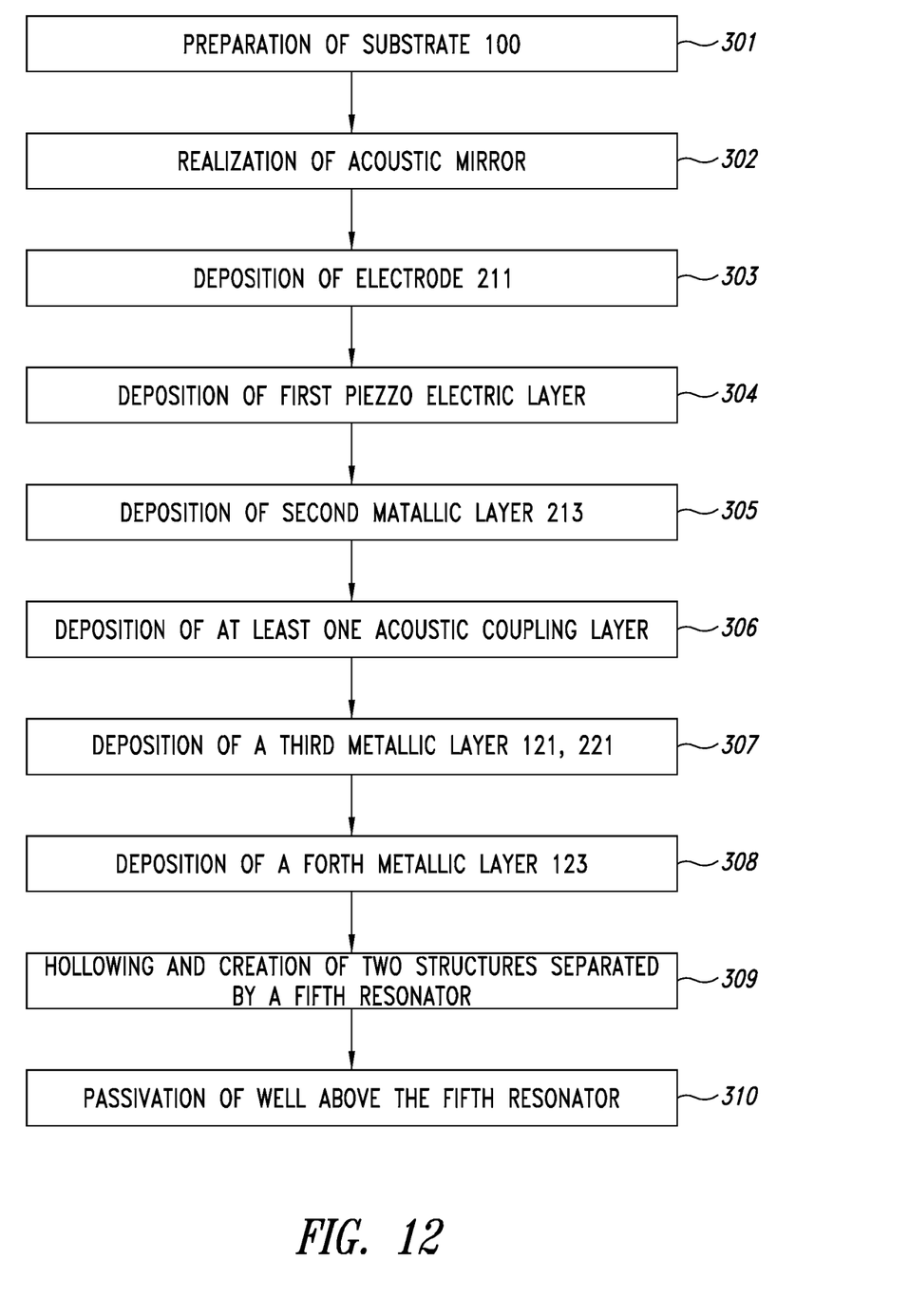
FIG. 12 illustrates a process for manufacturing a filtering circuit according to the present disclosure.

There is now described in conjunction with FIG. 12 the process for manufacturing a filtering circuit in accordance with one embodiment of the disclosure, which provides for the realization of an effective filter with coupled resonators using a process which is based in large part on the existing process of a known CRF filter. To this end, the process involves the following steps:

In a first step 301, a substrate 100 is prepared to receive resonator structures. The substrate may also be prepared to receive any other type of MOS structure.

In a next step 302, an acoustic mirror 101 is deposited above the substrate, which is accomplished according to known methods. In the next step 303, there is deposited a first metallic layer 211 that is intended to form the bottom electrode of the lower resonators. In a following step 304, the process proceeds with the deposition of a first piezoelectric layer 111;

In a subsequent step 305, a second metallic layer 213 intended to complete the structure of lower resonators 110 and 210 is deposited. In a further step 306, there is deposited one or several layers of material of acoustic coupling 130. In a following step 307, a third metallic layer intended to form the bottom electrode (121, 221) of upper resonators 120 and 220 is deposited.

Then, in a next step 308, there is the deposition of a second piezoelectric layer 122.

The process then proceeds in a next step 309, with a hollowing-out of the central part to reflect two structures, each with its own layer of acoustic coupling composed of part of that said one or several layers of acoustic coupling materials. More particularly, each structure (resp. LEFT, RIGHT) includes its own bottom electrode (resp. 121, 221) and top electrode (resp. 123, 223) with a layer of piezoelectric material (resp. 122, 222). The process then completes with a phase of passivation which closes the realized well.

Those steps result in the fact that the two structures show to be connected to each other by a fifth resonator 300, the electrodes (211, 213) and piezoelectric layer (111) of which being those of the lower resonators of the first and second structure.

The disclosure applies advantageously in mobile telephony, particularly in achieving band-pass filters intended to discriminate clearly two frequency bands particularly close.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A filter having coupled acoustic resonators, comprising:
    a substrate;
    an acoustic mirror on which is arranged the acoustic resonators, and also achieving isolation of those from the substrate;
    a first structure comprising an upper first resonator and a lower second resonator coupled to one another through at least one layer of acoustic coupling;
    a second structure with an upper third resonator and a lower fourth resonator coupled to one another through at least one layer of acoustic coupling; and
    the upper resonators of the first and second structure respectively comprising the input and the output of the filter, and the lower resonators of the first and second structures sharing the same electrodes; and
    the first and second structures are connected via a fifth resonator that shares electrodes and a piezoelectric layer with the lower resonators of the first and second structures, the first and second structures being symmetrical with respect to a vertical axis through the fifth resonator.

2. The filter of claim 1, wherein the resonators include electrodes made of tungsten (W), aluminum (Al), copper (Cu), molybdenum (Mo), nickel (Ni), titanium (Ti), silver (Ag), gold (Au) or tantalum (Ta).

3. The filter of claim 1, wherein it is used to realize a receive circuit for mobile telephony.

4. A filter, comprising:
    first and second resonator structures formed on a substrate and isolated therefrom by an acoustic mirror and coupled to one another by a third resonator structure formed over the acoustic mirror, the third resonator structure sharing electrodes and a piezoelectric layer of the first and second resonator structures, the first and second resonator structures each having an upper resonator and a lower resonator coupled to one another through at least one layer of acoustic coupling, the upper resonators of the first and second resonator structures respectively comprising an input and an output of the filter, and the lower resonators of the first and second resonator structures sharing the same electrodes, wherein the third resonator structure shares the electrodes and the piezoelectric layer of the lower resonators of the first and second resonator structures, and the first and second structures are physically symmetrical about a vertical axis through the third resonator structure.

5. The filter of claim 4, wherein the piezoelectric layer of the resonators includes a material that can be at least one from among ZnO, AlN, ZnS, and ferroelectric ceramic.

6. The filter of claim 4, wherein the resonators include electrodes made of tungsten (W), aluminum (Al), copper (Cu), molybdenum (Mo), nickel (Ni), titanium (Ti), silver (Ag), gold (Au) or tantalum (Ta).

7. A process, comprising:
    forming first and second resonator structures on a substrate so that the first and second resonator structures are isolated therefrom by an acoustic mirror, and coupling the first and second resonator structures to one another by a third resonator structure formed over the acoustic mirror, the third resonator structure sharing electrodes and a piezoelectric layer of the first and second resonator structures, the first and second resonator structures are formed to have an upper resonator and a lower resonator coupled to one another through at least one layer of acoustic coupling, and wherein the upper resonators of the first and second resonator structures respectively comprise an input and an output, and the lower resonators of the first and second resonator structures share the same electrodes, wherein the third resonator structure shares the electrodes and the piezoelectric layer of the lower resonators of the first and second resonator structures, and the first and second resonator structures are formed to be physically symmetrical about a vertical axis passing through the third resonator structure.

8. The process of claim 7, wherein the piezoelectric layer of the resonators comprises a piezoelectric material that can be ZnO, AlN, ZnS or any ferroelectric ceramics.

9. The process of claim 7, wherein the resonators include electrodes made of tungsten (W), aluminum (Al), copper (Cu), molybdenum (Mo), nickel (Ni), titanium (Ti), silver (Ag), gold (Au) or tantalum (Ta).

10. A mobile telephone, comprising:
a filter that includes:
first and second resonator structures formed on a substrate and isolated therefrom by an acoustic mirror and coupled to one another by a third resonator structure formed over the acoustic mirror, the third resonator structure sharing electrodes and a piezoelectric layer of the first and second resonator structures, the first and second resonator structures each having an upper resonator and a lower resonator coupled to one another through at least one layer of acoustic coupling, the upper resonators of the first and second resonator structures respectively comprising an input and an output of the filter, and the lower resonators of the first and second resonator structures sharing the same electrodes, wherein the third resonator structure shares the electrodes and the piezoelectric layer of the lower resonators of the first and second resonator structures, and the first and second resonator structures are physically symmetrical about a vertical axis through the third resonator structure.

11. The filter of claim 10, wherein the piezoelectric layer of the resonators includes a material that can be at least one from among ZnO, AlN, ZnS, and ferroelectric ceramic.

12. The filter of claim 10, wherein the resonators include electrodes made of tungsten (W), aluminum (Al), copper (Cu), molybdenum (Mo), nickel (Ni), titanium (Ti), silver (Ag), gold (Au) or tantalum (Ta).

13. A manufacturing process for a circuit filter with coupled resonators comprising the steps of:
preparing a substrate;
depositing an acoustic mirror above the substrate; and
depositing a first structure and a second structure having each a lower resonator with electrodes and a piezoelectric layer and an upper resonator, the lower and upper resonators separated by a layer of acoustic coupling, the first and second structures spaced apart in order to insert between the two a fifth resonator sharing the electrodes and the piezoelectric layer of the lower resonators, the first and second structures being symmetrical with respect to a vertical axis through the fifth resonator.

14. The manufacturing process of claim 13, the step of depositing the first and second structures further comprising:
providing a first metallic layer;
providing a first piezoelectric layer on the first metallic layer;
providing a second metallic layer on the first piezoelectric layer;
providing one or several layers of acoustic material of coupling to provide for the transmission of acoustic waves;
providing a third metallic layer on the acoustic material;
providing a second piezoelectric layer on the third metallic layer;
providing a fourth metallic layer on the second piezoelectric layer; and
etching in order to create a hollow separating the two structures and that is symmetrical about the vertical axis, each structure having:
its own layer of acoustic coupling composed of part of the one or several layers of materials of acoustic coupling.

15. The manufacturing process of claim 14, wherein the first and second piezoelectric layers each comprise a piezoelectric material that can be ZnO, AlN, ZnS or any ferroelectric ceramics.

16. A filter, comprising:
first and second lower resonators formed on a substrate and isolated therefrom by an acoustic mirror and coupled to one another by a third resonator formed over the acoustic mirror, the third resonator sharing electrodes and a piezoelectric layer of the first and second lower resonators, and fourth and fifth upper resonators formed over the first and second lower resonators and separated by a hollow over the third resonator that is symmetrical about a vertical axis through the third resonator.

17. The filter of claim 16, wherein the upper fourth resonator and the lower first resonator are coupled to one another through at least one layer of acoustic coupling, the upper fourth resonator and the upper fifth resonator respectively comprising an input and an output of the filter.

18. The filter of claim 17, wherein the first and second resonators are physically symmetrical about the vertical axis through the third resonator.

19. A mobile telephone, comprising:
a filter that includes:
first and second lower resonators formed on a substrate and isolated therefrom by an acoustic mirror and coupled to one another by a third resonator formed over the acoustic mirror, the third resonator sharing electrodes and a piezoelectric layer of the first and second lower resonators, and fourth and fifth upper resonators formed over the first and second lower resonators and separated by a hollow over the third resonator that is symmetrical about a vertical axis through the third resonator.

20. The telephone of claim 19, wherein the upper fourth resonator and the lower first resonator are coupled to one another through at least one layer of acoustic coupling, the upper fourth resonator and the upper fifth resonator respectively constituting an input and an output of the filter.

21. The telephone of claim 20, wherein the first and second resonators are physically symmetrical about the vertical axis through the third resonator structure.

22. A filter, comprising:
a substrate;
an acoustic mirror on the substrate and on which are arranged acoustic resonators, the mirror structured to achieve isolation of the acoustic resonators from the substrate;
a first structure formed on the acoustic mirror above the substrate and including an upper first acoustic resonator and a lower second acoustic resonator coupled to one another through at least one piezoelectric layer of acoustic coupling;

a second structure formed on the acoustic mirror above the substrate and including an upper third acoustic resonator and a lower fourth acoustic resonator coupled to one another through at least one piezoelectric layer of acoustic coupling; and the upper resonators of the first and second structures, respectively, having electrodes and structured as the input and the output of the filter, respectively, and the lower resonators of the first and second structures sharing a same electrode; and a fifth acoustic resonator connecting the first and second structures together, the fifth resonator sharing electrodes and a piezoelectric layer with the lower resonators of the first and second structures, the upper first and third acoustic resonators of the first and second structures separated by a hollow formed between the first and second structures and above the fifth acoustic resonator, the hollow separating the upper first and third acoustic resonators and the respective piezoelectric layer, and the hollow being symmetrical about a vertical axis through the fifth resonator.

23. The filter of claim 1, wherein the first and second structures are symmetrical compared to a vertical axis through the fifth resonator.

24. The filter of claim 1, wherein the resonators are Bulk Acoustic Wave (BAW) type resonators.

25. The filter of claim 24, wherein the BAW resonators are made by at least one from among the techniques of thin film deposition, sputtering, vacuum evaporation or deposition CVD.

26. The filter of claim 1, wherein the piezoelectric layer of the resonators includes a material that can be at least one from among ZnO, AlN, ZnS, and ferroelectric ceramic.

27. The filter of claim 1, wherein the resonators include electrodes made of tungsten (W), aluminum (Al), copper (Cu), molybdenum (Mo), nickel (Ni), titanium (Ti), silver (Ag), gold (Au) or tantalum (Ta).

* * * * *

UNITED STATES PATENT AND TRADEMARK OFFICE
CERTIFICATE OF CORRECTION

| | | |
|---|---|---|
| PATENT NO. | : 8,188,811 B2 | |
| APPLICATION NO. | : 12/371468 | |
| DATED | : May 29, 2012 | |
| INVENTOR(S) | : Andrea Cathelin et al. | |

It is certified that error appears in the above-identified patent and that said Letters Patent is hereby corrected as shown below:

Column 8, Line 52:
"among ZnO, AlN, ZnS, and ferroelectric ceramic." should read, --among ZnO, AlN, ZnS, and ferroelectric ceramic.--.

Column 9, Line 13:
"ZnO, AlN, ZnS or any ferroelectric ceramics." should read, --ZnO, AlN, ZnS or any ferroelectric ceramics.--.

Column 9, Line 43:
"among ZnO, AlN, ZnS, and ferroelectric ceramic." should read, --among ZnO, AlN, ZnS, and ferroelectric ceramic.--.

Column 10, Lines 17-18:
"material that can be ZnO, AlN, ZnS or any ferroelectric ceramics." should read, --material that can be ZnO, AlN, ZnS or any ferroelectric ceramics.--.

Column 12, Line 1:
"23. The filter of claim 1, wherein the first and second" should read, --23. The filter of claim 22, wherein the first and second--.

Column 12, Line 4:
"24. The filter of claim 1, wherein the resonators are Bulk" should read, --24. The filter of claim 22, wherein the resonators are Bulk--.

Column 12, Lines 10-12:
"26. The filter of claim 1, wherein the piezoelectric layer of resonators includes a material that can be at least one from among ZnO, AlN, ZnS, and ferroelectric ceramic." should read, --26. The filter of claim 22, wherein the piezoelectric layer of resonators includes a material that can be at least one from among ZnO, AlN, ZnS, and ferroelectric ceramic.--.

Signed and Sealed this
Twenty-third Day of October, 2012

David J. Kappos
*Director of the United States Patent and Trademark Office*

CERTIFICATE OF CORRECTION (continued)
U.S. Pat. No. 8,188,811 B2

Column 12, Line 13:
"27. The filter of claim 1, wherein the resonators include" should read, --27. The filter of claim 22, wherein the resonators include--.